United States Patent [19]
Chiu et al.

[11] 4,213,097
[45] Jul. 15, 1980

[54] HYBRID AUTOMATIC GAIN CONTROL CIRCUIT

[75] Inventors: Ran F. Chiu; Philip F. Kromer, III; Ming L. Kao, all of Miami; Henry H. Parrish, Miami Springs, all of Fla.

[73] Assignee: Racal-Milgo, Inc., Miami, Fla.

[21] Appl. No.: 952,650

[22] Filed: Oct. 19, 1978

[51] Int. Cl.² .............................................. H03G 3/20
[52] U.S. Cl. ...................................... 330/51; 330/129; 330/133; 330/134; 330/279
[58] Field of Search .................... 330/51, 86, 127, 128, 330/129, 133, 134, 144, 145, 278, 279, 284

[56] References Cited
U.S. PATENT DOCUMENTS

3,931,584  1/1976  Motley et al. ...................... 330/129

*Primary Examiner*—James B. Mullins
*Attorney, Agent, or Firm*—Jackson, Jones & Price

[57] ABSTRACT

An automatic gain control circuit having a coarse analog gain adjustment section producing discrete increments of db gain and a fine digital gain adjustment section. The digital section provides for adjustment of gain through a final increment of db gain to achieve precise gain setting. The output of the digital section is squared and compared to a reference signal to derive an error signal whose value is fed to an apparatus which iteratively determines the precise coarse increment and fine digital settings to achieve the final desired gain setting.

11 Claims, 2 Drawing Figures

HYBRID AUTOMATIC GAIN CONTROL CIRCUIT

BACKGROUND OF THE INVENTION

The subject invention relates to automatic gain control (AGC) circuitry and, more particularly, to an AGC circuit having both analog and digital gain adjustment portions. The subject invention finds particular utility in digital data modem implementations.

In such modem implementations it would be desirable to utilize a coarse analog gain control section to bring the gain within the range of an anlog to digital converter circuit, while having a digital gain control circuit at the output of the analog to digital converter to provide a steady, precise digital level for the modem circuitry to utilize. However, provision of such an automatic gain control circuit has presented the problem of how to establish cooperation among simultaneously operative analog and digital gain control sections in order to achieve smooth and rapid progression to the gain level desired.

SUMMARY OF THE INVENTION

It is therefore an object of the invention to improve automatic gain control circuitry.

It is another object of the invention to provide an automatic gain control circuit having both analog and digital sections.

It is yet another object of the invention to provide an automatic gain control circuit for use in a digital data modem providing cooperative, fast-attack, exponential adjustment of both digital and analog gain control sections.

According to the invention, an automatic gain control circuit is provided having an analog gain adjustment section and a digital gain adjustment section and means for producing first and second control signals which cooperate to adjust the gain provided by both the analog and digital sections to achieve the overall gain desired. An additional inventive feature of the subject invention is the provision of coarse incremental analog adjustment and a fine incremental adjustment over a continuous gain range around the desired gain together with first and second control signals adapted to cooperatively control the analog and digital sections.

BRIEF DESCRIPTION OF THE DRAWINGS

The preferred embodiment and best mode contemplated for implementing the just summarized invention will now be described in detail together with the drawings of which.

DETAILED DESCRIPTION OF THE PREFERRED EMBODIMENT

Figure 1:
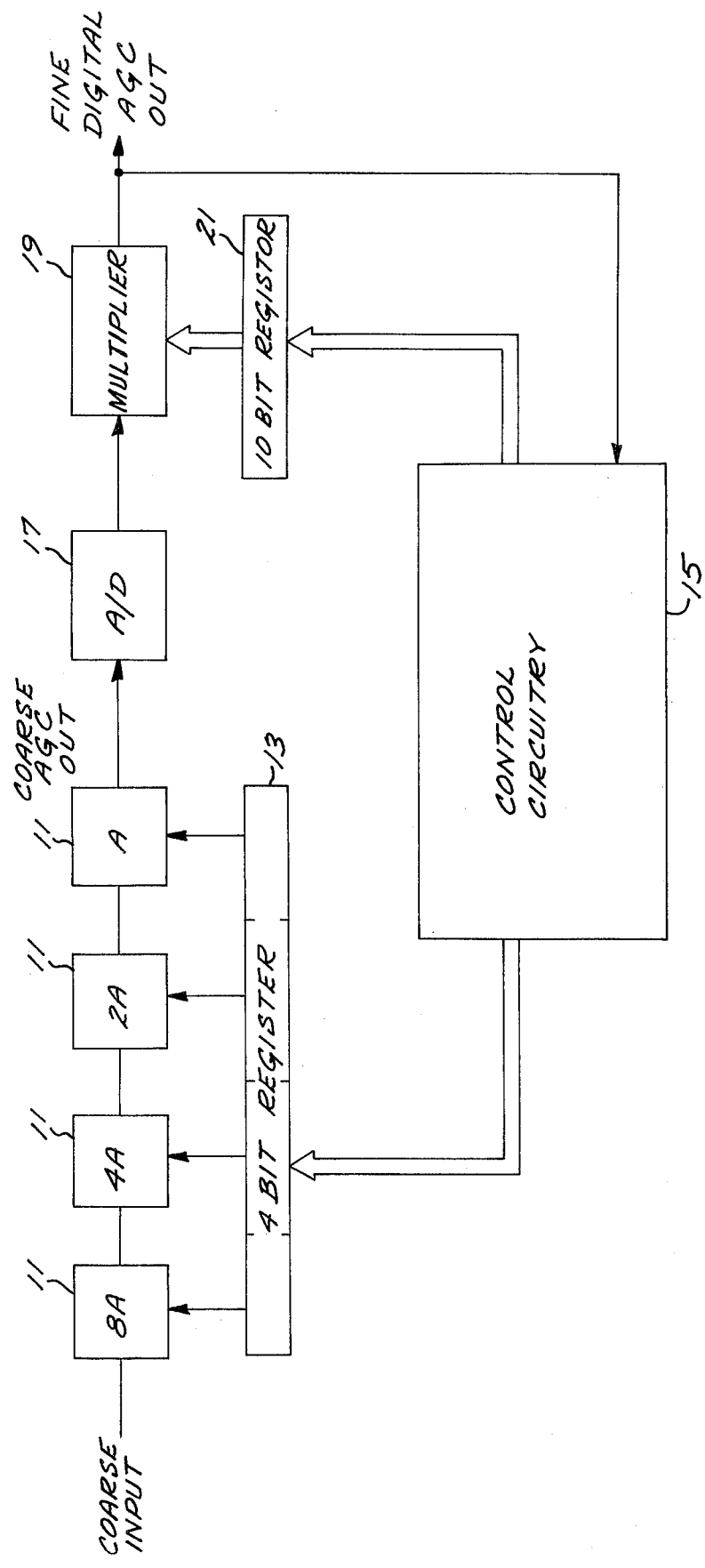
FIG. 1 is a block diagram illustrating the preferred embodiment of the invention.
Figure 2:
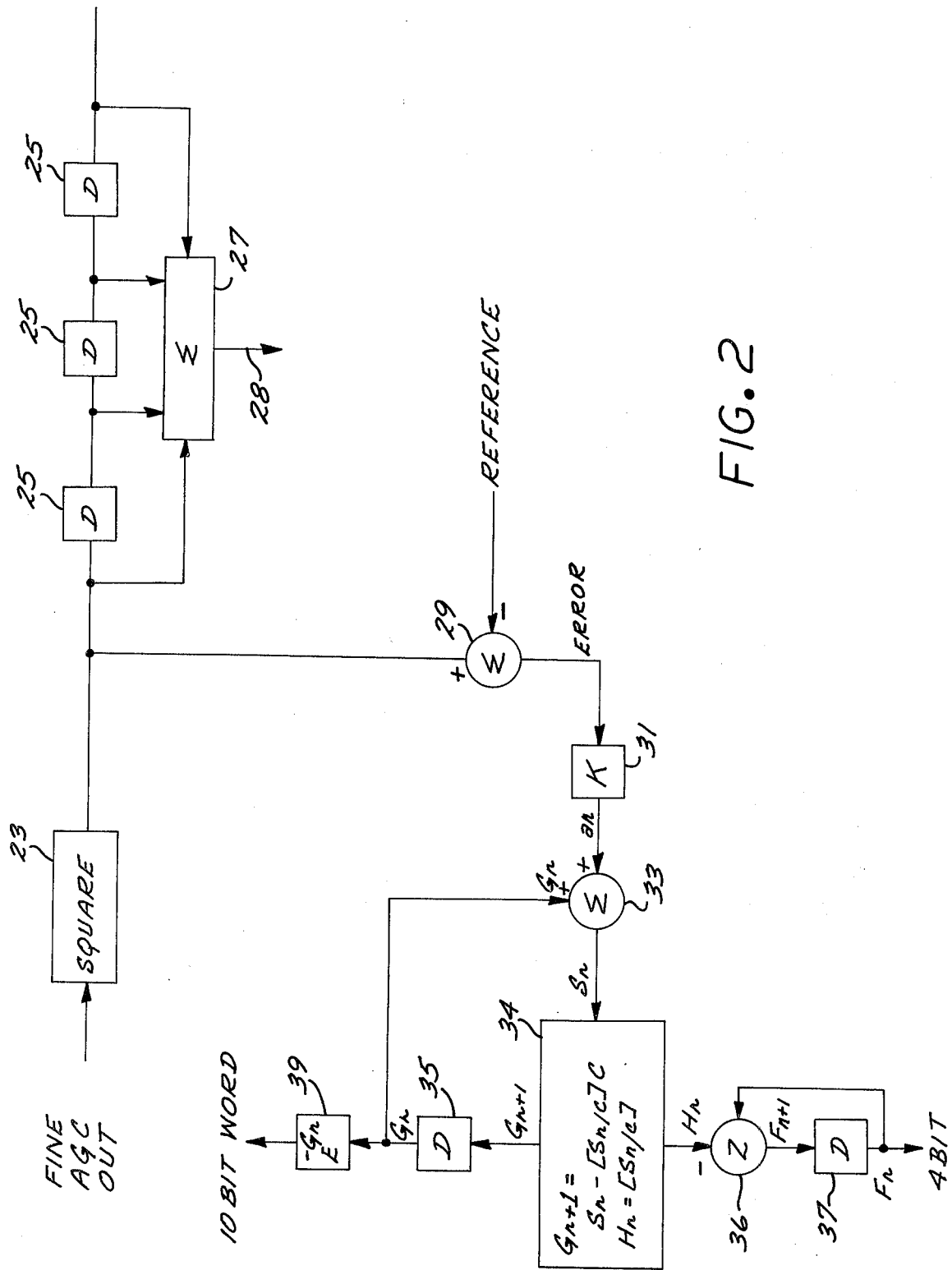
FIG. 2 is a functional circuit diagram illustrating the structure and operation of the control circuitry of FIG. 1.

The automatic gain control circuit of the preferred embodiment is illustrated in FIG. 1. The preferred embodiment includes four gain sections 11. These gain sections 11 provide analog gain of 8A, 4A, 2A and A respectively where A=2.17 db. These analog sections 11 are switched in or out of the path of the coarse input signal by a four bit number stored in a register 13 to provide sixteen possible gain combinations. The four bit number comes from the gain control circuitry 15 to be described subsequently, (FIG. 2). The four analog sections 11 comprise the coarse AGC adjustment. The output of the coarse AGC is fed to an analog to digital converter 17. The output of the analog to digital converter 17 is multiplied by a factor fA in a multiplier 19, where f is in the range of $-1$ to $+1$. The multiplying factor fA is determined by a 10 bit digital word coming from the AGC control circuitry 15 to be described.

The control circuitry 15 for generating the four bit word for controlling the coarse AGC and the ten bit word for controlling the fine AGC is illustrated in FIG. 2. In FIG. 2, the output of the fine AGC circuit is squared by a squaring circuit 23 and fed to a first summer 29 where a reference level is subtracted. The squaring circuit 23 could optionally be a full wave rectifier. Optionally, the output of the squarer 23 can be delayed and averaged by circuitry including delay elements 25 and an averaging circuit 27, and the output 28 of the delay and average circuit can be fed to the first summer 29. The output of the first summer 29 represents an error signal. This error signal is fed to a multiplier 31 where the error signal is multiplied by an AGC speed control constant K. If the constant K is bigger, the speed of the AGC will be faster but more error will be incurred. Likewise if K is smaller, the speed of the AGC will be slower but less error will arise. Desirably, during initial acquisition, the constant K is relatively large, and during the steady state, it is made smaller. The output of the multiplier 31 is defined as "$a_n$." The subscript "n" indicates the sample time during which the variable to which it is appended is generated. This output $a_n$ is fed to a summer 33 and summed with a quantity $G_n$ to produce an output $S_n$.

This output $S_n$ is passed to a block 34 where two quantities, $G_{n+1}$ and $H_n$ are determined. The quantity $G_{n+1}$ equals $S_n - [S_n/C] \cdot C$ and the quantity $H_n = [S/C]$, the quantity C being a constant equal to 0.25 and the expression $[S_n/C]$ defining the integer part of $S_n$ divided by C. A quantity $\exp(-G_n)$ is then calculated and is the gain of the fine portion of the AGC, that is the 10 bit number in register 21 for the next sample. $G_{n+1}$ is the remainder of dividing $S_n$ by C and exp (0.25) equals 2.17 db. $G_n$ is initially set to zero for n=0.

A summer 36 subtracts $H_n$ from $F_n$ to produce an output $F_{n+1}$ which is the four bit number controlling the analog section during the next sampling time. $F_n$ is initially=15 for n=0. The output $F_{n+1}$ is delayed one sample time by a delay element 37 to produce an output $F_n$ which is fed back as the second input to the summer 36. The output $F_n$ of the delay element 37 is the number which adjusts the coarse analog portion of the AGC, that is the four bit number in register 13, during the current sample time.

Digital circuit elements for performing the functions of the elements shown FIG. 2 are well known in the art. The preferred embodiment is preferably implemented with a digital microprocesser, such implementation being well within the skill of one of ordinary skill in the art assisted by this disclosure. The operation of the control circuitry 15 may be illustrated by an example.

Given a desired AGC output level of 0.5, the reference level input to summer 29 is chosen as the square of the desired value or 0.25. Other initial conditions are K=1, $F_0$=15 and $G_0$=0), and an incoming signal level of 0.02. With these conditions, the first three iterations of values determined by the circuitry of FIG. 2 are summarized in the following Table I.

TABLE I

| | $F_n$ | $G_n$ | $\exp(-G_n)$ | AGC Output |
|---|---|---|---|---|
| n = 0 | 15 | 0.0 | 1 | .9 |
| n = 1 | 13 | .06 | .94176 | .50667 |
| n = 2 | 13 | .06671 | .93546 | .50328 |

The example illustrates initial setting of the coarse adjustment with subsequent fine tuning of the digital portion of the AGC. With greater deviation from the desired value, more iterations may be required to initially set the coarse AGC and some alternations about the final value of the digital setting $\exp(-G_n)$ may occur. It may be noted that the exponential value $\exp(-G_n)$ may be approximated by a power series such as $1 - G_n + (G_n)^2/2$ in block 39.

The above circuit provides several desirable features. The analog portion provides the necessary coarse adjustment to give the required resolution for operation of the analog to digital converter. At the same time, a steady level is produced at the output of the fine digital AGC circuit enabling associated modem circuitry to properly operate. The digital AGC portion is used to compensate for the rough nature of the analog portion. A key to the operation of the circuit is a synchronization which is accomplished between the digital and analog portions in order to give a steady output signal. In other words, adjustments cooperate to allow the analog and digital portions to appear to be acting like one AGC circuit. The operation in block 34 provides a 2.17 dB hysteresis effect such that in the steady state only the digital fine AGC is operative. The exponential feedback provides a fast attack to the AGC adjustment.

As will be apparent to those skilled in the art, many modifications and adaptations of the just described preferred embodiment may be made without departing from the scope and spirit of the invention. Therefore, it is to be understood that, within the scope of the appended claims, the invention may be practiced other than as specifically described herein.

What is claimed is:

1. An automatic gain control circuit for controlling the gain provided to an input signal comprising:
   analog means responsive to a first control signal for adjusting said gain to provide a partially gain-corrected signal;
   means for converting said partially gain-corrected signal to a digital signal;
   digital means responsive to a second control signal for adjusting the gain of said digital signal to produce a second gain-corrected signal; and
   means responsive to said second gain-corrected signal for producing said first and second control signals.

2. The automatic gain control circuit of claim 1 wherein said control signal producing means simultaneously produces said first and second control signals.

3. The automatic gain control circuit of claim 1 wherein said means responsive to said second gain-corrected signal generates a quotient utilizing a divisor which is a constant related to exponential gain and wherein the integer portion of such quotient provides said first control signal while the remainder portion is used to generate said second control signal.

4. The automatic gain control circuit of claim 1 wherein said analog means comprises a plurality of stages of analog gain increments selectable in response to said first control signal.

5. The automatic gain control circuit of claim 1 or 4 wherein said digital means comprises means for multiplying said partially gain-corrected signal by said second control signal and wherein said second control signal represents a gain variable over a continuous range.

6. The automatic gain control circuit of claim 5 wherein the said gains are linear in decibels.

7. The automatic gain control circuit of claim 1 wherein said control signal producing means includes:
   means for generating an error signal from said second gain-corrected signal, and
   means receiving as an input said error signal for generating from said error signal said first and second control signals.

8. The automatic gain control circuit of claim 7 wherein said error signal generating means comprises:
   means for squaring said second gain corrected signal; and
   means for comparing said second gain-corrected signal to a reference signal to produce said error signal.

9. The automatic gain control circuit of claim 7 wherein said error signal generating means comprises:
   means for deriving or approximating the difference between the mean-square value of said second gain-corrected signal and a suitably selected reference signal to produce said error signal.

10. The automatic gain control circuit of claim 7 wherein said receiving means comprises:
    means for summing said error signal with a present gain exponent to produce a dividend;
    means for dividing said dividend by a constant related to a gain increment in decibels;
    means for determining the integer portion of said quotient and the remainder portion of said quotient;
    means for determining said first control signal from said integer portion; and
    means for determining said present gain exponent and said second control signal from said remainder portion.

11. An automatic gain control circuit for adjusting the gain of an input signal to a desired value comprising:
    a plurality of stages of analog gain, each stage providing an increment of decibel gain and being selectably insertable into the path of said input signal to provide its associated gain to said input signal to produce a coarsely corrected signal in response to a digital control signal;
    means for converting said coarsely corrected signal into a digital signal;
    means for multiplying said digital signal by a digital number selectably variable to represent a gain continuously variable over a range to provide an output signal representing a fine gain adjustment of said coarsely corrected signal; and
    means responsive to the deviation of said output signal from said desired value for generating said digital control signal and digital number in such a manner that said output signal converges to the value of said desired output signal.

* * * * *